United States Patent
Tan et al.

(10) Patent No.: US 10,242,845 B2
(45) Date of Patent: Mar. 26, 2019

(54) NEAR-SUBSTRATE SUPPLEMENTAL PLASMA DENSITY GENERATION WITH LOW BIAS VOLTAGE WITHIN INDUCTIVELY COUPLED PLASMA PROCESSING CHAMBER

(71) Applicant: Lam Research Corporation, Fremont, CA (US)

(72) Inventors: Zhongkui Tan, San Jose, CA (US); Yiting Zhang, Fremont, CA (US); Qian Fu, Pleasanton, CA (US); Qing Xu, Fremont, CA (US); Ying Wu, Dublin, CA (US); Saravanapriyan Sriraman, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/408,326

(22) Filed: Jan. 17, 2017

(65) Prior Publication Data

US 2018/0204708 A1 Jul. 19, 2018

(51) Int. Cl.
*C23C 16/02* (2006.01)
*H01L 21/3213* (2006.01)
(Continued)

(52) U.S. Cl.
CPC .... *H01J 37/32165* (2013.01); *C23C 16/0245* (2013.01); *H01J 37/321* (2013.01);
(Continued)

(58) Field of Classification Search
None
See application file for complete search history.

(56) References Cited

U.S. PATENT DOCUMENTS 5,888,414 A * 3/1999 Collins ................. C23C 16/517
156/345.48
2002/0004309 A1 * 1/2002 Collins ................. C23C 16/507
438/719

(Continued)

FOREIGN PATENT DOCUMENTS

JP 2011518408 A 6/2011
KR 101368505 B1 2/2014

OTHER PUBLICATIONS

International Search Report and Written Opinion, PCT/US2017/057728, dated Feb. 7, 2018, 11 pages.

*Primary Examiner* — Stephanie P Duclair
(74) *Attorney, Agent, or Firm* — Penilla IP, APC

(57) ABSTRACT

A substrate is positioned on a substrate support structure within a plasma processing volume of an inductively coupled plasma processing chamber. A first radiofrequency signal is supplied from a first radiofrequency signal generator to a coil disposed outside of the plasma processing volume to generate a plasma in exposure to the substrate. A second radiofrequency signal is supplied from a second radiofrequency signal generator to an electrode within the substrate support structure. The first and second radiofrequency signal generators are controlled independent of each other. The second radiofrequency signal has a frequency greater than or equal to about 27 megaHertz. The second radiofrequency signal generates supplemental plasma density at a level of the substrate within the plasma processing volume while generating a bias voltage of less than about 200 volts at the level of the substrate.

15 Claims, 6 Drawing Sheets

(51) Int. Cl.
*H01J 37/32* (2006.01)
*H01L 21/311* (2006.01)
*H05H 1/46* (2006.01)

(52) U.S. Cl.
CPC ..... *H01J 37/3211* (2013.01); *H01J 37/32119* (2013.01); *H01J 37/32715* (2013.01); *H01L 21/31116* (2013.01); *H01L 21/31138* (2013.01); *H01L 21/32136* (2013.01); *H01J 2237/332* (2013.01); *H01J 2237/334* (2013.01); *H05H 2001/4667* (2013.01)

(56) References Cited

U.S. PATENT DOCUMENTS

| | | |
|---|---|---|
| 2007/0193982 A1 | 8/2007 | Brown et al. |
| 2011/0097901 A1* | 4/2011 | Banna .................. H01J 37/321 438/710 |
| 2011/0192349 A1* | 8/2011 | Hammond, IV ...... C23C 16/509 118/723 E |
| 2012/0000888 A1* | 1/2012 | Kawasaki ......... H01J 37/32082 216/67 |
| 2013/0059448 A1 | 3/2013 | Marakhtanov et al. |
| 2013/0213935 A1 | 8/2013 | Liao et al. |

* cited by examiner

NEAR-SUBSTRATE SUPPLEMENTAL PLASMA DENSITY GENERATION WITH LOW BIAS VOLTAGE WITHIN INDUCTIVELY COUPLED PLASMA PROCESSING CHAMBER

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency of the RF power applied, and magnitude of the RF power applied, among others. Therefore, it is of interest to understand, monitor, and/or control some of the process parameters that may affect the characteristics of the generated plasma, particularly with regard to delivery of the RF power to the plasma generation region. It is within this context that the present invention arises.

SUMMARY

In an example embodiment, a method is disclosed for operating an inductively coupled plasma processing chamber. The method includes positioning a substrate on a substrate support structure within a plasma processing volume of the inductively coupled plasma processing chamber. The method also includes supplying a first radiofrequency signal from a first radiofrequency signal generator to a coil disposed outside of the plasma processing volume of the inductively coupled plasma processing chamber. The first radiofrequency signal generates a plasma in exposure to the substrate. The method also includes supplying a second radiofrequency signal from a second radiofrequency signal generator to an electrode within the substrate support structure simultaneously with supplying of the first radiofrequency signal from the first radiofrequency signal generator to the coil. The first and second radiofrequency signal generators are controlled independent of each other. The second radiofrequency signal has a frequency greater than or equal to about 27 megaHertz. The second radiofrequency signal generates supplemental plasma density at a level of the substrate within the plasma processing volume. The second radiofrequency signal generates a bias voltage of less than about 200 volts at the level of the substrate.

In an example embodiment, an inductively coupled plasma processing system is disclosed. The system includes a chamber enclosing a plasma processing volume. The chamber includes an upper window structure. The system also includes a coil disposed outside the chamber at location to allow for transmission of radiofrequency signals from the coil through the upper window structure into the plasma processing volume. The system also includes a substrate support structure disposed within the chamber. The substrate support structure is configured to hold a substrate in exposure to the plasma processing volume. The system also includes an electrode disposed within the substrate support structure. The system also includes a first radiofrequency signal generator connected to supply a first radiofrequency signal to the coil. The system also includes a second radiofrequency signal generator connected to supply a second radiofrequency signal to the electrode within the substrate support structure. The second radiofrequency signal generator is independently controllable relative to the first radiofrequency signal generator. The second radiofrequency signal has a frequency greater than or equal to about 27 megaHertz. The second radiofrequency signal is defined to generate supplemental plasma density at a level of the substrate when present upon the substrate support structure. The second radiofrequency signal generates a bias voltage of less than about 200 volts at the level of the substrate when present upon the substrate support structure.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
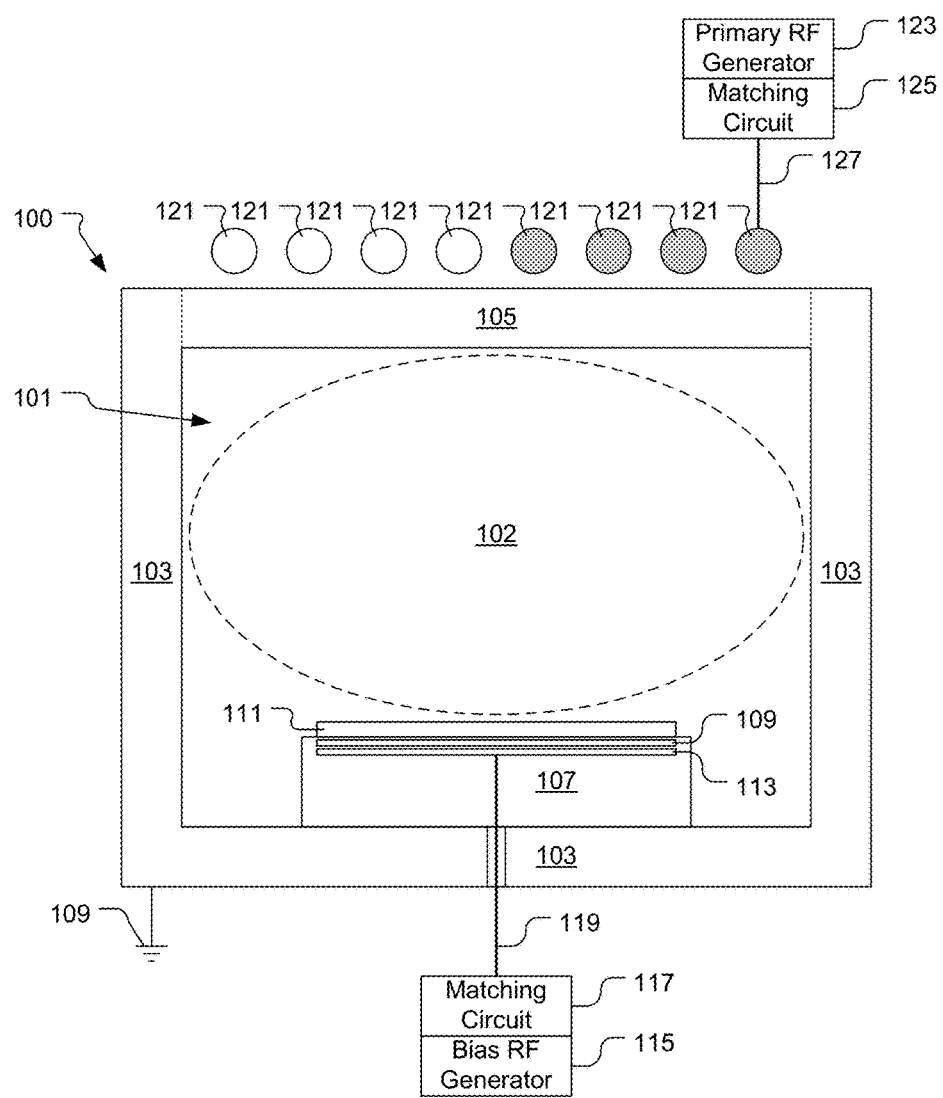
FIG. 1 shows an example diagram of an ICP processing chamber, in accordance with some embodiments of the present invention.

In the semiconductor industry, semiconductor substrates can undergo fabrication operations in an inductively coupled plasma (ICP) plasma processing chamber. The ICP processing chamber can also be referred to as a transformer coupled plasma (TCP) processing chamber. For ease of discussion herein, ICP processing chamber will be used to refer to both ICP and TCP processing chambers. FIG. 1 shows an example diagram of an ICP processing chamber 100, in accordance with some embodiments of the present invention. It should be understood that the ICP processing chamber 100 can be any type of ICP processing chamber in which radiofrequency signals are transmitted from a coil disposed outside the ICP processing chamber to a process gas within the ICP processing chamber to generate a plasma within the ICP processing chamber, where the plasma is used to affect a change in a condition of a substrate in exposure to the plasma. FIG. 1 shows a coil 121 from which radiofrequency signals are transmitted into a plasma processing volume 101 to generate a plasma 102 within the plasma processing volume 101 in exposure to a substrate 111.

In some embodiments, the substrate 111 is a semiconductor wafer undergoing a fabrication procedure. However, it should be understood that in various embodiments, the substrate 111 can be essentially any type of substrate that is subjected to a plasma-based fabrication process. For example, in some embodiments, the term substrate 111 as used herein can refer to substrates formed of sapphire, GaN, GaAs or SiC, or other substrate materials, and can include glass panels/substrates, metal foils, metal sheets, polymer materials, or the like. Also, in various embodiments, the substrate 111 as referred to herein may vary in form, shape, and/or size. For example, in some embodiments, the substrate 111 referred to herein may correspond to a 200 mm (millimeters) semiconductor wafer, a 300 mm semiconductor wafer, or a 450 mm semiconductor wafer. Also, in some embodiments, the substrate 111 referred to herein may correspond to a non-circular substrate, such as a rectangular substrate for a flat panel display, or the like, among other shapes.

The plasma processing volume 101 of the ICP processing chamber 100 is formed within a surrounding structure 103 and below an upper window structure 105 and above a substrate support structure 107. In some embodiments, the surrounding structure 103 is formed of an electrically conductive material, such as a metal, that is mechanically and chemically compatible with the environment and materials present within the plasma processing volume 101 during operation of the ICP processing chamber 100. In these embodiments, the surrounding structure 103 can be electrically connected to a reference ground potential 109.

The substrate support structure 107 is configured to support the substrate 111 in a secure manner in exposure to the plasma 102 generated within the plasma processing volume 101. In some embodiments, the substrate support structure 107 is an electrostatic chuck that includes one or more clamp electrodes 109 to which electric power can be supplied to generate an electrostatic field for clamping the substrate 111 onto the substrate support structure 107. In various embodiments, the electric power supplied to the one or more clamp electrodes 109 can be radiofrequency power, direct current power, or a combination of both radiofrequency power and direct current power.

The substrate support structure 107 can also include a bias electrode 113 to which radiofrequency bias power can be supplied to generate a bias voltage ($V_b$) at the substrate 111 level within the plasma processing volume 101. The radiofrequency power transmitted from the bias electrode 113 into the plasma processing volume 101 is referred to as the bias radiofrequency power. In some embodiments, the bias radiofrequency power is generated by a bias radiofrequency signal generator 115 and is transmitted through an impedance matching circuit 117 and through a transmission rod 119 to the bias electrode 113. The transmission rod 119 is electrically insulated from the surrounding structure 103 of the ICP processing chamber 100. The matching circuit 117 includes an arrangement of capacitors and/or inductors configured to ensure that an impedance seen by the bias radiofrequency signal generator 115 at the transmission rod 119 is sufficiently close to a load impedance for which the bias radiofrequency signal generator 115 is designed to operate, so that radiofrequency signals generated and transmitted by the bias radiofrequency signal generator 115 will be transmitted into the plasma processing volume 101 in an efficient manner, i.e., without unacceptable reflection.

Figure 2:
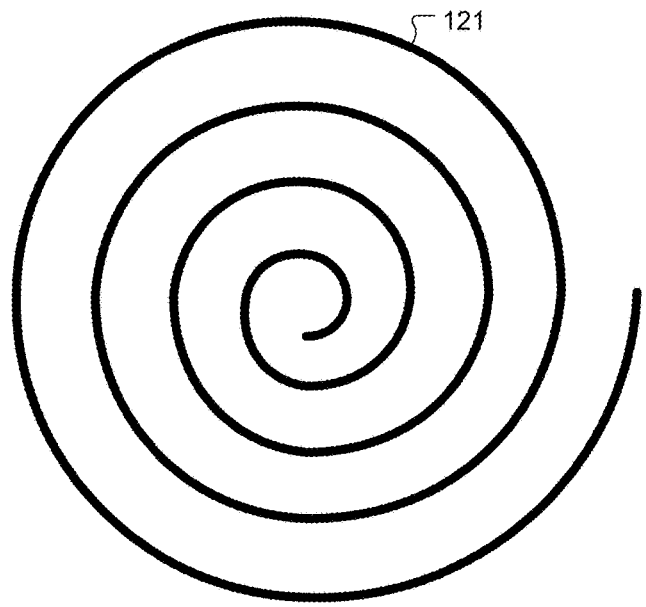
FIG. 2 shows a top view of the example coil of FIG. 1, in accordance with some embodiments of the present invention.

The ICP processing chamber 100 operates by flowing one or more process gases into the plasma processing volume 101, and by applying radiofrequency power from the coil 121 to the one or more process gases to transform the one or more process gases into the plasma 102 in exposure to the substrate 111, in order to affect a change in material or surface condition on the substrate 111. The coil 121 is disposed above the upper window structure 105. In the example of FIG. 1, the coil 121 is formed as a radial coil assembly, with the shaded parts of the coil 121 turning into the page of the drawing and with the unshaded parts of the coil 121 turning out of the page of the drawing. FIG. 2 shows a top view of the example coil 121 of FIG. 1, in accordance with some embodiments of the present invention. It should be understood, however, that in other embodiments the coil 121 can be of essentially any configuration that is suitable for transmitting radiofrequency power through the upper window structure 105 and into the plasma processing volume 101. In various embodiments, the coil 121 can have any number of turns and any cross-section size and shape (circular, oval, rectangular, trapezoidal, etc.) as required to provide the necessary transmission of radiofrequency signals through the upper window structure 105 into the plasma processing volume 101.

The radiofrequency power transmitted from the coil 121 into the plasma processing volume 101 is referred to as the plasma primary radiofrequency power. The plasma primary radiofrequency power is generated by a primary radiofrequency signal generator 123 and is transmitted through an impedance matching circuit 125 and through an electrical connection 127 to the coil 121. The matching circuit 125 includes an arrangement of capacitors and/or inductors configured to ensure that an impedance seen by the primary radiofrequency signal generator 123 at the coil 121 is sufficiently close to a load impedance for which the primary radiofrequency signal generator 123 is designed to operate, so that radiofrequency signals supplied to the coil 121 by the primary radiofrequency signal generator 123 will be transmitted into the plasma processing volume 101 in an efficient manner, i.e., without unacceptable reflection.

Figure 3:
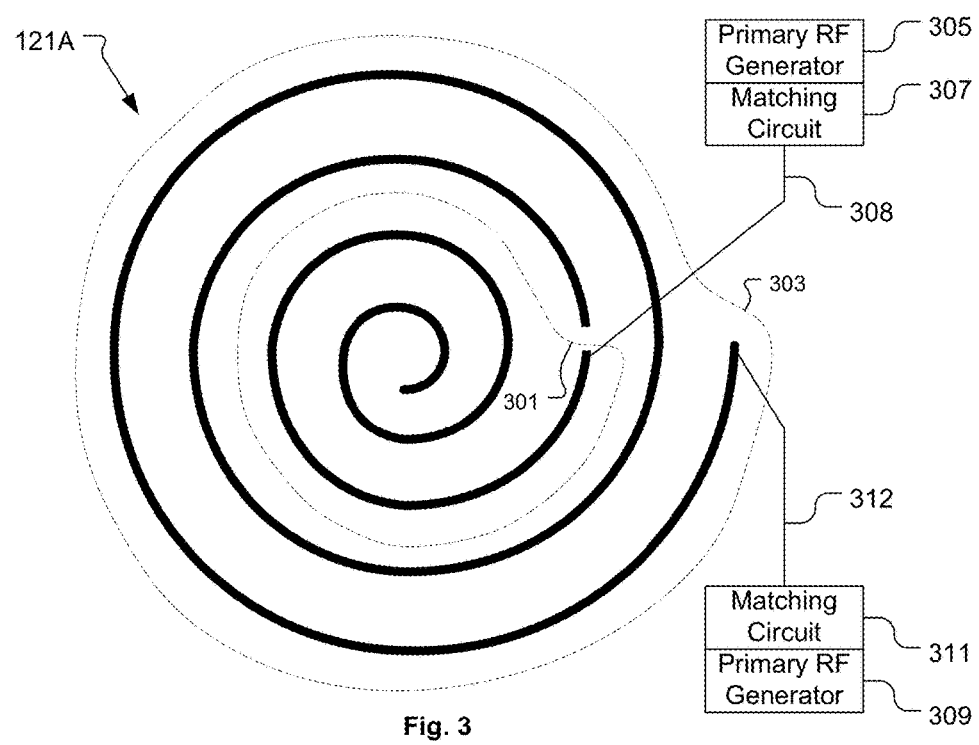
FIG. 3 shows a multizone coil that includes two independently controlled zones, in accordance with some embodiments of the present invention.

Also, in some embodiments, the coil 121 can include multiple sections or zones, where each of the multiple sections or zones is independently controllable with regard to a power and a frequency of the radiofrequency signals with which they are supplied. For example, FIG. 3 shows a multizone coil 121A that includes two independently controlled zones, in accordance with some embodiments of the present invention. In the example of FIG. 3, the multizone coil 121A includes an inner zone 301 and an outer zone 303. The inner zone 301 is connected to receive radiofrequency signals from a corresponding primary radiofrequency signal generator 305 by way of a corresponding matching circuit 307 and electrical connection 308. The matching circuit 307 includes an arrangement of capacitors and/or inductors configured to ensure that an impedance seen by the primary radiofrequency signal generator 305 at the inner zone 301 of the coil 121A is sufficiently close to a load impedance for which the primary radiofrequency signal generator 305 is designed to operate, so that radiofrequency signals generated and transmitted by the primary radiofrequency signal generator 305 will be transmitted into the plasma processing volume 101 in an efficient manner, i.e., without unacceptable reflection.

And, the outer zone 303 is connected to receive radiofrequency signals from a corresponding primary radiofrequency signal generator 309 by way of a corresponding matching circuit 311 and electrical connection 312. The matching circuit 311 includes an arrangement of capacitors and/or inductors configured to ensure that an impedance seen by the primary radiofrequency signal generator 309 at the outer zone 303 of the coil 121A is sufficiently close to a load impedance for which the primary radiofrequency signal generator 309 is designed to operate, so that radiofrequency signals generated and transmitted by the primary radiofrequency signal generator 309 will be transmitted into the plasma processing volume 101 in an efficient manner, i.e., without unacceptable reflection.

It should be understood that the multizone coil 121A of FIG. 3 is presented by way of example. In various embodiments, the multizone coil 121A can include any number of zones, with each zone spanning a specified corresponding radial extent above the upper window structure 105. Also, it should be understood that the number of turns in the example coil 121A is presented by way of example. In various embodiments, the coil 121A can have any number of turns and any cross-section size and shape (circular, oval, rectangular, trapezoidal, etc.) as required to provide the necessary transmission of radiofrequency signals through the upper window structure 105 into the plasma processing volume 101.

The ICP processing chamber 100 has certain advantages in plasma process control in various plasma-based semiconductor fabrication applications, such as in plasma etching, by way of example. The ICP processing chamber 100 provides for separate control of plasma density (ion flux/radical flux) and ion energy. Specifically, the plasma density can be controlled to a certain extent by the plasma primary radiofrequency power that is transmitted from the coil 121 through the upper window structure 105 into the plasma processing volume 101. And, the ion energy can be controlled by the bias voltage ($V_b$) that is generated at the substrate level by the bias radiofrequency power transmitted from the bias electrode 113 into the plasma processing volume 101. Separate control of plasma density (which directly correlates to ion flux and radical flux) and ion energy is particularly useful in some semiconductor fabrication applications. For example, in patterning applications where high plasma density is needed to obtain a required etch rate and where low ion energy is required to reduce damage to one or more materials present on the substrate, such as photoresist material. It should be understood that in addition to patterning applications, many other plasma-based semiconductor fabrication applications can also benefit from separate control of plasma density and ion energy.

With the ICP processing chamber 100, the plasma density can be increased through control of the plasma primary radiofrequency power supplied to the coil 121, and the bias voltage ($V_b$) can be controlled through control of the bias radiofrequency power supplied to the bias electrode 113. Also, the plasma primary radiofrequency power/frequency and the bias radiofrequency power/frequency may need to be controlled in different ways at the same time to achieve a desired result. For example, in some embodiments, to obtain increased plasma density in conjunction with low ion energy, the plasma primary radiofrequency power needs to be high and at the same time the bias radiofrequency power needs to be low. It should be appreciated that separate control of plasma density and ion energy is not available in capacitively coupled plasma (CCP) processing chambers (as opposed to ICP processing chambers), because in the CCP processing chambers the plasma density and ion energy is provided/controlled by the same radiofrequency power source(s).

In some fabrication applications a high density plasma is needed at the substrate level to obtain an increased ion flux and/or increased radical flux near the substrate to obtain an increased interaction rate on the substrate, and simultaneously, a low ion energy is required at the substrate level to avoid damage to material on the substrate and/or to reduce directionality of the ion flux incident upon the substrate, i.e., to have a more isotropic ion flux at the substrate level. In these fabrication applications, the plasma density needs to be increased at the substrate level without increasing the bias voltage ($V_b$) at the substrate level. For example, in a patterning application, a photoresist material can be used to provide a protective coating over portions of the substrate during an etching operation. In this situation, a high bias voltage ($V_b$) can increase the ion energy to the point where the ions that are incident upon the photoresist material will sputter the photoresist material off of the substrate. And, because it is necessary for the photoresist material to remain through the entirety of the etching process, it is of interest to keep the bias voltage ($V_b$) at the substrate level low, e.g., less than 200 V (volts), to avoid sputtering of the photoresist material and premature loss of the photoresist material.

In some situations, the plasma primary radiofrequency power transmitted from the coil 121 through the upper dielectric window 105 into the plasma processing volume 101 does not provide enough plasma density at the substrate level to obtain a necessary etch rate and/or etch selectivity. One reason for this is that the density of the plasma 102 generated by the plasma primary radiofrequency power transmitted from the coil 121 decreases with increased distance from the coil 121. Therefore, with increased distance between the coil 121 and the substrate support structure 107, it becomes more difficult to obtain a required plasma density at the substrate level. Also, the lower frequency of the bias radiofrequency power that is applied to the bias electrode 113 generates a direct current bias voltage ($V_b$) on the substrate 111 without contributing much to the plasma density near the substrate 111.

Additionally, it may not be possible to simply increase the plasma primary radiofrequency power supplied to the coil 121 beyond a specified maximum amount, such as about 3 kW (kiloWatts), due to potential damage caused by overheating of the upper window structure 105. Also, reducing the distance between the coil 121 and substrate support structure 107 would require a costly redesign of the ICP processing chamber 100, and potentially cause problems with regard to plasma uniformity at the substrate 111 level, and present other challenges.

Methods and systems are disclosed herein for providing an increase in plasma density at the substrate 111 level without causing an increase in ion energy at the substrate 111 level. The methods and systems disclosed herein can be implemented with the ICP processing chamber 100 and do not require an increase in the supply of plasma primary radiofrequency power to the coil 121. The methods and systems disclosed herein use the bias electrode 113 to transmit specially controlled radiofrequency signals into the plasma processing volume 101 to generate supplemental plasma density locally at the substrate 111 level without increasing the ion energy at the substrate 111 level.

The bias radiofrequency power applied at the substrate 111 level by the bias radiofrequency signal generator 115 generates some amount of plasma density at the substrate 111 level, i.e., just above the substrate. Generally, the bias voltage ($V_b$) generated by the radiofrequency signals supplied by the bias radiofrequency signal generator 115 is inversely proportional to the frequency (f) of these radiofrequency signals ($V_b \propto 1/f$). Because the bias radiofrequency power ($P_b$) is given by the product of the bias voltage ($V_b$) and the bias current ($I_b$), i.e., ($P_b = V_b * I_b$), when the bias voltage ($V_b$) is lower, the bias current ($I_b$) has to be correspondingly higher to have the same bias radiofrequency power ($P_b$). Therefore, to achieve a higher plasma density from a given bias radiofrequency power ($P_b$), it is necessary to have a lower bias voltage ($V_b$) and a correspondingly higher bias current ($I_b$). And, because the bias voltage ($V_b$) is inversely proportional to the frequency (f) of the bias radiofrequency signals, in order to obtain a lower bias voltage ($V_b$) for a given bias radiofrequency power ($P_b$), the frequency (f) of the bias radiofrequency signals can be increased. Therefore, to obtain an increase in the plasma density generated at the substrate 111 level, while simultaneously keeping the bias voltage ($V_b$) low, radiofrequency signals of higher frequency (f) can be supplied to the bias electrode 113.

At the substrate 111 level, the effective plasma density is the sum of the plasma density generated by the plasma primary radiofrequency power and the plasma density generated by the radiofrequency signals supplied to the bias electrode 113. In some embodiments where a higher plasma density is needed at the substrate 111 level without increasing the ion energy at the substrate 111 level, a supplemental plasma density radiofrequency power is supplied to the bias electrode 113 at a high frequency (e.g., greater than or equal to about 27 MHz (megaHertz)) to generate supplemental plasma density at the substrate 111 level with low bias voltage ($V_b$) (e.g., less than about 200 V), and a bias radiofrequency power is also supplied to the bias electrode 113 at a low frequency (e.g., less than or equal to about 15 MHz) to provide control of the bias voltage ($V_b$), and a plasma primary radiofrequency power is supplied to the coil 121 to generate the plasma 102 within the plasma processing volume 101.

It should be appreciated that use of the substrate-level supplemental plasma density radiofrequency power at high frequency (e.g., greater than or equal to about 27 MHz) in the ICP processing chamber 100 is not intuitive because supplying radiofrequency signals to the bias electrode 113 at such high frequency does not generate an appreciable amount of bias voltage ($V_b$), which has conventionally been the primary purpose for supplying radiofrequency signals to the bias electrode 113. Also, it should be noted that the ions present in the supplemental plasma that is generated by the high frequency substrate-level supplemental plasma density radiofrequency power are more diffusive so as to have a wider angular distribution due to more ion scattering in the plasma sheath.

Figure 4:
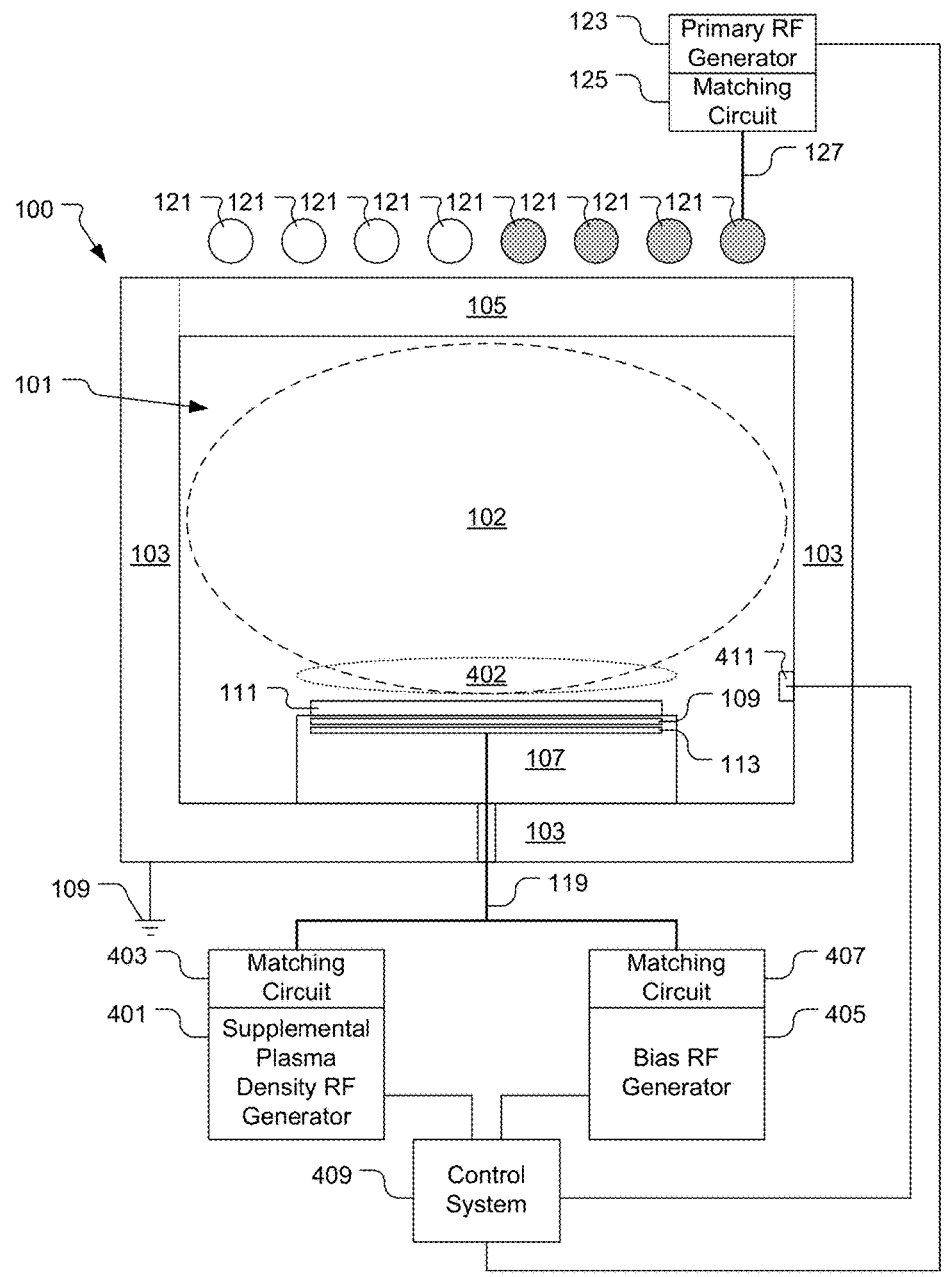
FIG. 4 shows the ICP processing chamber with the three radiofrequency signal generators, in accordance with some embodiments of the present invention.

In some embodiments, to provide improved process control and especially to provide for separate control of the ion density and ion energy within the plasma, three radiofrequency signal generators are utilized in conjunction with the ICP processing chamber 100. FIG. 4 shows the ICP processing chamber 100 with the three radiofrequency signal generators, in accordance with some embodiments of the present invention. The primary radiofrequency signal generator 123 is used to supply the plasma primary radiofrequency power to the coil 121. A substrate-level supplemental plasma density radiofrequency signal generator 401 is used to supply the substrate-level supplemental plasma density radiofrequency power to the bias electrode 113 for generating supplemental plasma 402 at the substrate 111 level, as indicated by the dotted line in FIG. 4, without appreciably increasing the energy of the ions at the substrate 111 level. The substrate-level supplemental plasma density radiofrequency signal generator 401 transmits radiofrequency signals of high frequency (e.g., greater than or equal to about 27 MHz) through a corresponding impedance matching circuit 403 to the transmission rod 119. Also, a bias radiofrequency signal generator 405 is used to supply the bias radiofrequency power to the bias electrode 113 for generating bias voltage ($V_b$) at the substrate 111 level to control the ion energy at the substrate 111 level. The bias radiofrequency signal generator 405 transmits radiofrequency signals of low frequency (e.g., less than or equal to about 15 MHz) through a corresponding impedance matching circuit 407 to the transmission rod 119.

In some embodiments, the primary radiofrequency signal generator 123 is operated to generate radiofrequency signals at a frequency within a range extending from about 10 MHz to about 15 MHz, and to supply the plasma primary radiofrequency power within a range extending from about 1 kW to about 4 kW, to generate the plasma 102 within the plasma processing volume 101. With regard to the frequency of radiofrequency signals stated herein, the term "about" indicates plus or minus 10% of a stated frequency value. Also, with regard to the radiofrequency power values stated herein, the term "about" indicates plus or minus 10% of a stated radiofrequency power value. In some embodiments, the primary radiofrequency signal generator 123 is operated to generate radiofrequency signals at a frequency of about 13.56 MHz, and to supply the plasma primary radiofrequency power within a range extending from about 1 kW to about 4 kW, to generate the plasma 102 within the plasma processing volume 101.

In some embodiments, the substrate-level supplemental plasma density radiofrequency signal generator 401 is operated to generate radiofrequency signals at a high frequency within a range extending from about 27 MHz to about 140 MHz, and at a radiofrequency power within a range extending up to about 1 kW, to generate the supplemental plasma density 402 at the substrate 111 level within the plasma processing volume 101. In some embodiments, the substrate-level supplemental plasma density radiofrequency signal generator 401 is operated to generate radiofrequency signals at a high frequency of about 27 MHz or about 60 MHz, and at a radiofrequency power of less than or equal to about 1 kW or less than or equal to about 500 W (Watts) or less than or equal to about 200 W or less than or equal to about 100 W, to generate the supplemental plasma density 402 at the substrate 111 level within the plasma processing volume 101.

In some embodiments, the bias radiofrequency signal generator 405 is operated to generate radiofrequency signals at a low frequency within a range extending from about 100 kHz (kiloHertz) to about 15 MHz, and at a radiofrequency power within a range extending from about 5 W to about 6 kW, to generate the bias voltage ($V_b$) at the substrate 111 level within the plasma processing volume 101. In some embodiments, the bias radiofrequency signal generator 405 is operated to generate radiofrequency signals at a low frequency of about 13.56 MHz or about 1 MHz, and at a radiofrequency power within a range extending from about 5 W to about 6 kW or within a range extending up to about 3 kW, to generate the bias voltage ($V_b$) at the substrate 111 level within the plasma processing volume 101.

In the ICP processing chamber 100 configuration of FIG. 4, it should be understood that the substrate-level supplemental plasma density radiofrequency signal generator 401 is operated at higher frequency to generate supplemental plasma density at the substrate 111 level to increase the ion flux and/or radical flux at the substrate 111 level without substantially contributing to the generation of bias voltage ($V_b$), i.e., without increasing the energy of the ions at the substrate 111 level. And, the bias radiofrequency signal generator 405 is operated at lower frequency to generate bias voltage ($V_b$) at the substrate 111 level to control the energy and directionality (angle of incidence) of the ions at the substrate 111 level relative to a reference direction perpendicular to the top surface of the substrate support structure 107.

Figure 5:
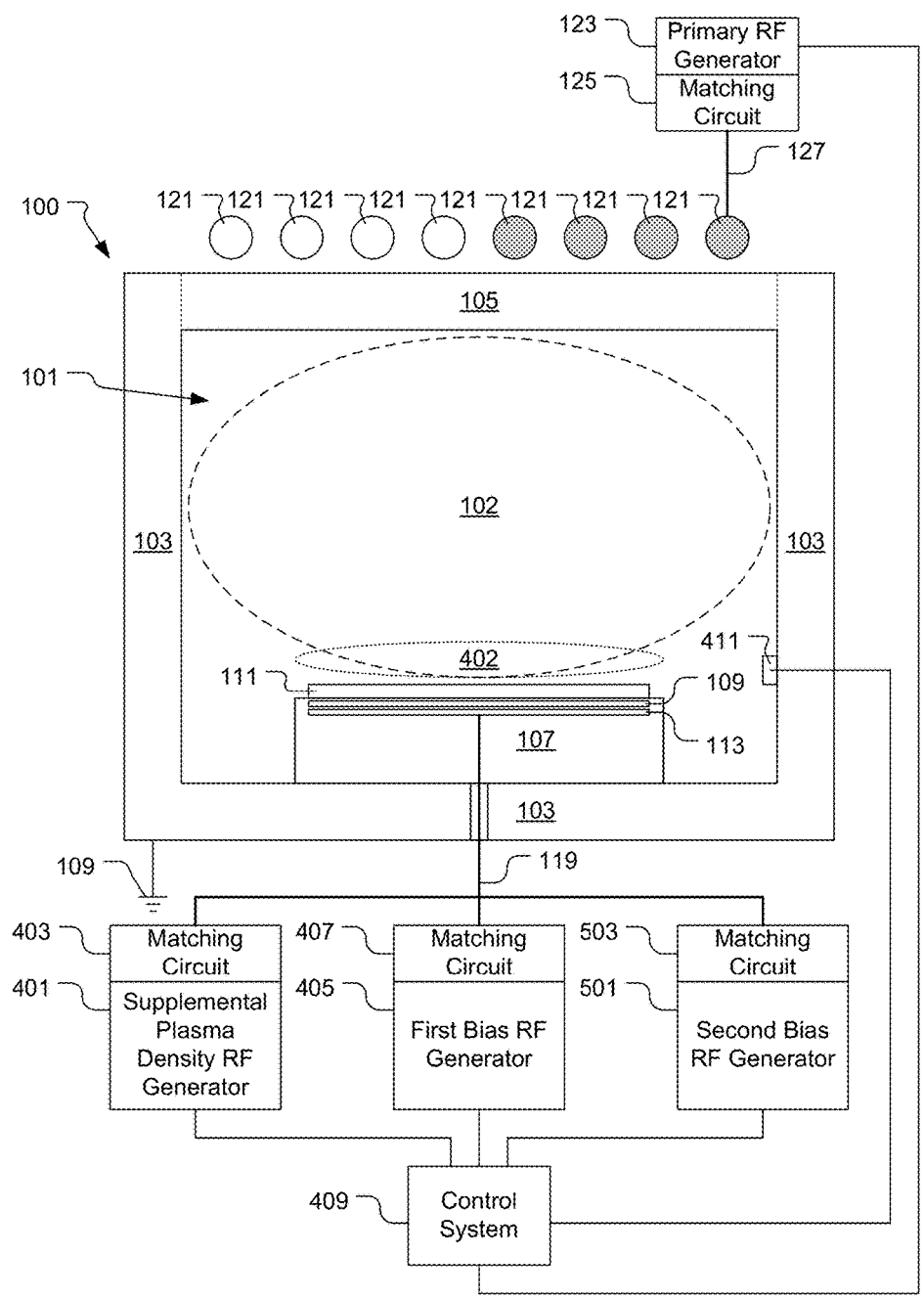
FIG. 5 shows a modification of the ICP processing chamber of FIG. 4 to include a second bias radiofrequency signal generator, in accordance with some embodiments of the present invention.

In some embodiments of the present invention, the ICP processing chamber 100 includes a fourth radiofrequency signal generator in conjunction with the three radiofrequency signal generators described above with regard to FIG. 4. For example, FIG. 5 shows a modification of the ICP processing chamber 100 of FIG. 4 to include a second bias radiofrequency signal generator 501, in accordance with some embodiments of the present invention. In this configuration, the bias radiofrequency signal generator 405 is referred to as a first bias radiofrequency signal generator 405. The second bias radiofrequency signal generator 501 transmits radiofrequency signals of low frequency through a corresponding impedance matching circuit 503 to the transmission rod 119. As with the first bias radiofrequency signal generator 405, the second bias radiofrequency signal generator 501 is also used to supply bias radiofrequency power to the bias electrode 113 for generating bias voltage ($V_b$) at the substrate 111 level to control the ion energy at the substrate 111 level. However, it should be understood and appreciated that the second bias radiofrequency signal generator 501 can be operated at a different frequency than the first bias radiofrequency signal generator 405 to provide increased process control over both the ion energy distribution at the substrate 111 level and the ion angular distribution at the substrate 111 level. Also, it should be understood and appreciated that the frequencies and/or power levels of the second bias radiofrequency signal generator 501 and the first bias radiofrequency signal generator 405 can be mixed in continuous wave operation and/or can be pulsed at different levels, such as described in related U.S. patent application Ser. Nos. 14/932,458 and 14/863,331, each of which is incorporated herein by reference in its entirety for all purposes.

In some embodiments, the first bias radiofrequency signal generator 405 and the second bias radiofrequency signal generator 501 are operated at different frequencies. For example, the second bias radiofrequency signal generator 501 can be operated at a lower frequency relative to the first bias radiofrequency signal generator 405 in order to provide a lower ion angular distribution at the substrate 111 level, so that the ions approach the substrate 111 in a direction that is more perpendicularly oriented relative to the plane of the substrate 111. It should be appreciated that the lower ion angular distribution is useful in some plasma-based fabrication applications that require more directionality of the ion flux at the substrate 111 level, such as in high aspect ratio etching applications, among others. In an example embodiment, the first bias radiofrequency signal generator 405 is operated at a frequency of about 13.56 MHz, and the second bias radiofrequency signal generator 501 is operated at a frequency of about 1 MHz or less. However, it should be understood that in other embodiments, the first bias radiofrequency signal generator 405 and the second bias radiofrequency signal generator 501 can be operated at other frequencies as needed to obtain a required ion energy distribution and ion angular distribution at the substrate 111 level. Also, in various embodiments, both the first bias radiofrequency signal generator 405 and the second bias radiofrequency signal generator 501 are operated at a radiofrequency power within a range extending from about 5 W to about 6 kW or within a range extending up to about 3 kW.

The ICP processing chamber 100 of both FIG. 4 and FIG. 5 includes a control system 409 that is configured to control the frequency and power of each of the substrate-level supplemental plasma density radiofrequency generator 401 and the first bias radiofrequency signal generator 405 and the second bias radiofrequency signal generator 501 and the primary radiofrequency signal generator 123. In some embodiments, one or more metrology devices 411 can be disposed within the ICP processing chamber 100 to obtain a real-time measurement of the bias voltage ($V_b$) present at the substrate 111 level. In some embodiments, the one or more metrology devices 411 can be implemented as one or more ion energy analyzer(s). In some embodiments, the one or more metrology devices 411 can be configured to measure the plasma potential. In some embodiments, the one or more metrology devices 411 can be implemented as one or more voltage probe(s) respectively calibrated for the various frequencies of radiofrequency power applied to the plasma processing volume 101. It should be understood, that the one or more metrology devices 411 can be disposed essentially anywhere in the ICP processing chamber 100, including within the substrate support structure 107, with consideration to ensure that the one or more metrology devices 411 do not adversely impact generation and control of the plasma 102 and supplemental plasma 402.

In various embodiments, for a given ICP processing chamber 100 configuration, frequency-dependent trends of radiofrequency power versus ion energy versus ion density can be empirically generated for various process parameter combinations (such as combinations of process gas chemistry, process gas flow rate, temperature, pressure, etc.). These frequency-dependent trends can be utilized within the control system 409 to provide for either static or dynamic (real-time) control of the frequency and power of each of the substrate-level supplemental plasma density radiofrequency generator 401 and the first bias radiofrequency signal generator 405 and the second bias radiofrequency signal generator 501 and the primary radiofrequency signal generator 123.

Also, although the example of FIG. 5 implements one substrate-level supplemental plasma density radiofrequency generator 401, it should be understood that in various embodiments more than one independently controllable substrate-level supplemental plasma density radiofrequency generator can be implemented. In these other embodiments, each substrate-level supplemental plasma density radiofrequency generator will have a corresponding matching circuit and be connected to supply radiofrequency signal through its matching circuit to the bias electrode 113. Also, although the example of FIG. 5 implements two bias radiofrequency signal generators 405 and 501, it should be understood that in various embodiments more than two independently controllable bias radiofrequency signal generators can be implemented. In these other embodiments, each bias radiofrequency generator will have a corresponding matching circuit and be connected to supply radiofrequency signal through its matching circuit to the bias electrode 113.

Figure 6A:
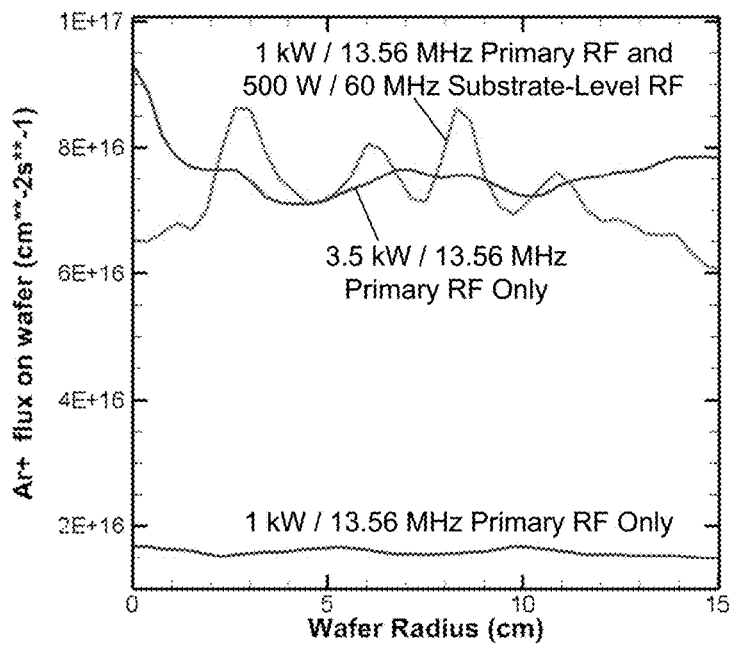
FIG. 6A shows plots of argon ion flux on the substrate as a function of center-to-edge radial distance across the substrate, in accordance with some embodiments of the present invention.
Figures 6B, 6C:
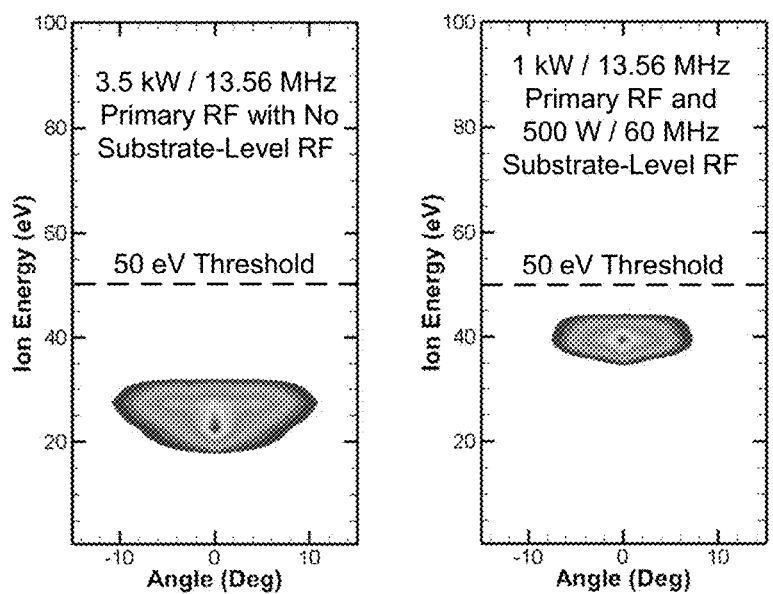
FIG. 6B shows a plot of the ion energy versus ion angular distribution for supply of 3.5 kW of radiofrequency power at the frequency of 10 MHz to the coil only, and without supply of radiofrequency power at the substrate level, in accordance with some embodiments of the present invention.
FIG. 6C shows a plot of the ion energy versus ion angular distribution for supply of 1 kW of radiofrequency power at the frequency of 10 MHz to the coil, and with supply of 500 W of radiofrequency power at the frequency of 60 MHz at the substrate 111 level, in accordance with some embodiments of the present invention.

FIGS. 6A, 6B, and 6C show simulation results that demonstrate the effect of using the substrate-level supplemental plasma density radiofrequency generator 401, in accordance with some embodiments of the present invention. Argon is used as the process gas to generate the simulation results of FIGS. 6A, 6B, and 6C. FIG. 6A shows plots of argon ion flux on the substrate (wafer) (in units of ions per $cm^2$ per second) as a function of center-to-edge radial distance across the substrate (wafer radius) (in units of cm), in accordance with some embodiments of the present invention. Specifically, FIG. 6A shows a plot of argon ion flux on the substrate as a function of center-to-edge radial distance across the substrate corresponding to operation of the primary radiofrequency signal generator 123 at a frequency of 10 MHz and a power of 1 kW and without operation of any of the substrate-level supplemental plasma density radiofrequency generator 401 and the first bias radiofrequency signal generator 405 and the second bias radiofrequency signal generator 501. FIG. 6A also shows a plot of argon ion flux on the substrate as a function of center-to-edge radial distance across the substrate corresponding to operation of the primary radiofrequency signal generator 123 at a frequency of 10 MHz and a power of 3.5 kW and without operation of any of the substrate-level supplemental plasma density radiofrequency generator 401 and the first bias radiofrequency signal generator 405 and the second bias radiofrequency signal generator 501. FIG. 6A also shows a plot of argon ion flux on the substrate as a function of center-to-edge radial distance across the substrate corresponding to operation of the primary radiofrequency signal generator 123 at a frequency of 10 MHz and a power of 1 kW in conjunction with operation of the substrate-level supplemental plasma density radiofrequency generator 401 at a frequency of 60 MHz and a power of 500 W, and without operation of either the first bias radiofrequency signal generator 405 or the second bias radiofrequency signal generator 501.

The simulation results of FIG. 6A indicates that with 500 W radiofrequency power supplied at a frequency of 60 MHz at the substrate 111 level, i.e., to the bias electrode 113, in conjunction with supply of 1 kW radiofrequency power at a frequency of 10 MHz to the coil 121, the ion flux on the substrate 111 surface is about four times higher than what is obtained by supplying only the 1 kW radiofrequency power at the frequency of 10 MHz to the coil 121. So, the results shown in FIG. 6A demonstrate that the plasma density and ion flux increase with a supply of only 500 W radiofrequency power at the frequency of 60 MHz at the substrate level. FIG. 6A also shows that in order to use the coil 121 only to match the plasma density obtained by supplying 500 W radiofrequency power supplied at the frequency of 60 MHz at the substrate 111 level in conjunction with supply of 1 kW radiofrequency power at the frequency of 10 MHz to the coil 121, the coil 121 operating alone would have to be supplied with 3.5 kW of radiofrequency power at the frequency of 10 MHz. It should be appreciated that application of such high radiofrequency power, e.g., 3.5 kW, to the coil 121 may exceed the maximum allowed radiofrequency power that can be safely supplied to the coil 121 due to concerns with heat-induced damage of the upper window structure 105, and/or other concerns. Also, it should be appreciated that it is more energy efficient to generate supplemental plasma density at the substrate level by operating the substrate-level supplemental plasma density radiofrequency generator 401 at a few hundred Watts, as compared with having to operate the coil 121 at a few thousand Watts to generate the same supplemental plasma density at the substrate level.

FIG. 6B shows a plot of the ion energy (eV) versus ion angular distribution (relative to the reference direction perpendicular to the plane of the substrate 111) for supply of 3.5 kW of radiofrequency power at the frequency of 10 MHz to the coil 121 only, and without supply of radiofrequency power at the substrate 111 level, i.e., to the bias electrode 113, in accordance with some embodiments of the present invention. FIG. 6C shows a plot of the ion energy (eV) versus ion angular distribution (relative to the reference direction perpendicular to the plane of the substrate 111) for supply of 1 kW of radiofrequency power at the frequency of 10 MHz to the coil 121, and with supply of 500 W of radiofrequency power at the frequency of 60 MHz at the substrate 111 level, i.e., to the bias electrode 113, in accordance with some embodiments of the present invention. FIGS. 6B and 6C indicate that operation of the substrate-level supplemental plasma density radiofrequency generator 401 to supply high frequency radiofrequency power to the bias electrode 113 can be done without exceeding a low bias voltage ($V_b$) threshold of 50 V. The bias voltage ($V_b$) generated by the substrate-level supplemental plasma density radiofrequency generator 401 operating at the frequency of 60 MHz is 4 to 10 times less than the bias voltage ($V_b$) that would be obtained by supplying radiofrequency at a low frequency of 13.56 MHz to the bias electrode 113. Also, as a point of comparison, a capacitively coupled plasma (CCP) processing chamber operating at a bias radiofrequency power of 500 W and frequency of 60 MHz would generate a bias voltage ($V_b$) greater than 200 V.

In some embodiments, both the plasma primary radiofrequency power supplied to the coil 121 by the primary radiofrequency signal generator 123 and the supplemental plasma density radiofrequency power supplied by the substrate-level supplemental plasma density radiofrequency generator 401 are controlled in an integrated manner to provide a prescribed plasma density distribution over the substrate 111. For example, with the multizone coil 121A of FIG. 3, the inner zone 301 and the outer zone 303 of the coil 121A can be operated independently to compensate for perturbations in the plasma density distribution across the substrate 111 that may be introduced by operation of the substrate-level supplemental plasma density radiofrequency generator 401 to supply supplemental plasma density radiofrequency power to the bias electrode 113. For example, if operation of the substrate-level supplemental plasma density radiofrequency generator 401 causes a higher increase in plasma density near the center of the substrate 111 relative to the periphery of the substrate 111, the plasma primary radiofrequency power supplied to the outer zone 303 of the coil 121A can be increased and/or the plasma primary radiofrequency power supplied to the inner zone 301 of the coil 121A can be decreased, in order to obtain a more uniform plasma density distribution across the substrate 111, i.e., in order to control the center-to-edge plasma uniformity across the substrate 111.

The substrate-level supplemental plasma density generation methods and systems disclosed herein can be particularly useful in plasma-based fabrication applications in which a higher plasma density is needed near the substrate surface without an increase in ion energy near the substrate surface. An example target application for the methods and systems disclosed herein is a 3D NAND stair etch application, in which the photoresist lateral trim operations require both high plasma density and low ion energy at the substrate level, and in which underlying oxide and/or nitride layer etching operations require high ion energy and increased ion directionality toward the substrate. In this example target application, the substrate-level supplemental plasma density radiofrequency signal generator 401 can be operated to supply higher frequency (27 MHz or greater) radiofrequency signals to the bias electrode 113 during the photoresist lateral trim operations and can be turned off during the underlying oxide and/or nitride layer etching operations. Also, in this example target application, one or both of the first bias radiofrequency signal generator 405 and the second bias radiofrequency signal generator 501 can be turned off during the photoresist lateral trim operations and can be operated to supply lower frequency (15 MHz or less) radiofrequency signals to the bias electrode 113 during the underlying oxide and/or nitride layer etching operations. Use of the substrate-level supplemental plasma density radiofrequency signal generator 401 to supply high frequency radiofrequency power to the bias electrode 113 during the photoresist lateral trim operations can increase the etch rate in the 3D NAND stair etch application by 100% or more, without causing damage to underlying layers due to the low bias voltage ($V_b$) and correspondingly low ion energy that is correspondingly generated, which can improve overall fabrication throughput by 30% or more.

Another example target application for the methods and systems disclosed herein is an extreme ultraviolet (EUV) lithography application for fabricating logic devices and/or DRAM devices, in which it is difficult to achieve a sufficient amount of selectivity of DARC (dielectric antireflective coating) material to photoresist material due to the extremely low thickness of EUV photoresist material (typically less than or equal to about 20 nm (nanometers)). In the EUV lithography application, high radical density (i.e., high plasma density) is needed at the substrate level to provide polymer deposition to protect the EUV photoresist material, and low ion energy is needed to avoid damage to the EUV photoresist material. In the EUV lithography application, use of the substrate-level supplemental plasma density radiofrequency signal generator 401 to supply high frequency radiofrequency power to the bias electrode 113 will increase the plasma density at the substrate level without increasing the ion energy at the substrate level.

It should be understood that the 3D NAND stair etch and EUV lithography are examples of target applications in which the substrate-level supplemental plasma density generation methods and systems disclosed herein can be useful, but are in no way limiting to the methods and systems disclosed herein. The substrate-level supplemental plasma density generation methods and systems disclosed herein can be used in any plasma-based processing application performed within an ICP processing chamber in which a higher plasma density is needed at the substrate level while maintaining a low bias voltage ($V_b$) at the substrate level.

Figure 7:
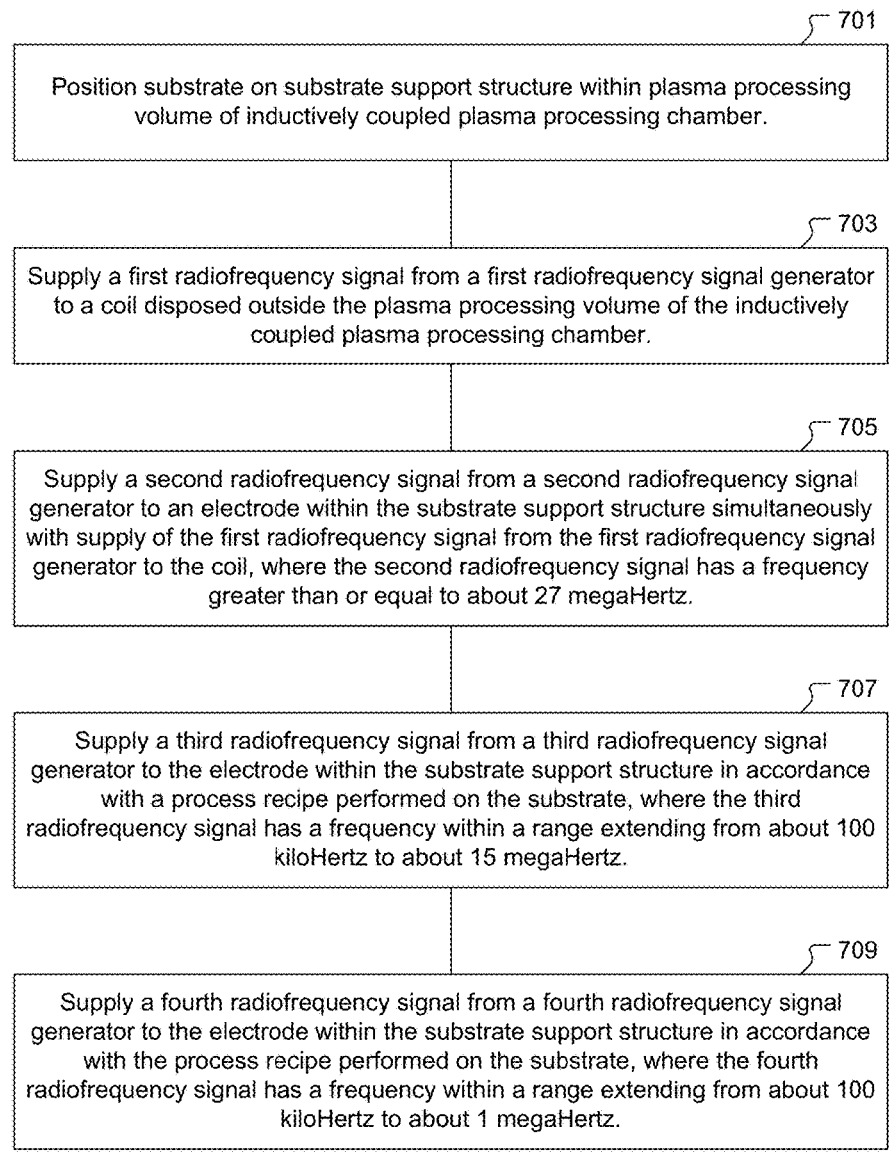
FIG. 7 shows a flowchart of a method for operating an inductively coupled plasma processing chamber, in accordance with some embodiments of the present invention.

FIG. 7 shows a flowchart of a method for operating an inductively coupled plasma processing chamber (100), in accordance with some embodiments of the present invention. The method includes an operation 701 for positioning a substrate (111) on a substrate support structure (107) within a plasma processing volume (101) of the inductively coupled plasma processing chamber (100). The method also includes an operation 703 for supplying a first radiofrequency signal from a first radiofrequency signal generator (123) to a coil (121/121A) disposed outside of the plasma processing volume (101) of the inductively coupled plasma processing chamber (100). The first radiofrequency signal generates a plasma (102) in exposure to the substrate (111). In some embodiments, the first radiofrequency signal is supplied at a frequency within a range extending from about 10 megaHertz to about 15 megaHertz, and the first radiofrequency signal is supplied at a power within a range extending from about 1 kiloWatt to about 4 kiloWatts.

The method also includes an operation 705 for supplying a second radiofrequency signal from a second radiofrequency signal generator (401) to an electrode (113) within the substrate support structure (107) simultaneously with supplying of the first radiofrequency signal from the first radiofrequency signal generator (123) to the coil (121/121A). The first and second radiofrequency signal generators (123 and 401) are controlled independent of each other. The second radiofrequency signal has a frequency greater than or equal to about 27 megaHertz. The second radiofrequency signal generates supplemental plasma density (402) at a level of the substrate (111) within the plasma processing volume (101). The second radiofrequency signal generates a bias voltage ($V_b$) of less than about 200 volts at the level of the substrate (111).

In some embodiments, the second radiofrequency signal is supplied at a frequency within a range extending from about 27 megaHertz to about 140 megaHertz, and the second radiofrequency signal is supplied at a power within a range extending from about 5 Watts to about 1 kiloWatt. In some embodiments, the second radiofrequency signal is supplied at a frequency of about 27 megaHertz, and the second radiofrequency signal is supplied at a power within a range extending from about 5 Watts to about 1 kiloWatt. In some embodiments, the second radiofrequency signal is supplied at a frequency of about 60 megaHertz, and the second radiofrequency signal is supplied at a power within a range extending from about 5 Watts to about 1 kiloWatt.

In some embodiments, the coil (121A) includes multiple independently controllable radial zones (301, 303, etc.). The method further includes controlling radiofrequency signals supplied to the multiple independently controllable radial zones (301, 303, etc.) of the coil (121A) to compensate for a perturbation in plasma density profile across the substrate (111) caused by the supplemental plasma density generated at the level of the substrate (111) by the second radiofrequency signal.

In some embodiments, the method also includes an operation 707 for supplying a third radiofrequency signal from a third radiofrequency signal generator (405) to the electrode (113) within the substrate support structure (107) in accordance with a process recipe performed on the substrate (111). The first and second and third radiofrequency signal generators (123 and 401 and 405) are controlled independent of each other. In some embodiments, the third radiofrequency signal has a frequency within a range extending from about 100 kiloHertz to about 15 megaHertz, and the third radiofrequency signal is supplied at a power within a range extending from about 5 Watts to about 6 kiloWatts. The third radiofrequency signal generates a bias voltage ($V_b$) greater than about 200 volts at the level of the substrate (111).

In some embodiments, the third radiofrequency signal has a frequency of about 13.56 megaHertz. In some embodiments, the third radiofrequency signal is supplied from the third radiofrequency signal generator (405) to the electrode (113) within the substrate support structure (107) during directional ion-based processing of the substrate (111), and the third radiofrequency signal is not supplied from the third radiofrequency signal generator (405) to the electrode (113) within the substrate support structure (107) during isotropic processing of the substrate (111).

In some embodiments, the method also includes an operation 709 for supplying a fourth radiofrequency signal from a fourth radiofrequency signal generator (501) to the electrode (113) within the substrate support structure (107) in accordance with the process recipe performed on the substrate (111). The first and second and third and fourth radiofrequency signal generators (123, 401, 405, and 501) are controlled independent of each other. In some embodiments, the fourth radiofrequency signal has a frequency within a range extending from about 100 kiloHertz to about 1 megaHertz, and the fourth radiofrequency signal is supplied at a power within a range extending from about 5 Watts to about 6 kiloWatts. In some embodiments, the fourth radiofrequency signal controls a directionality of ions at the level of the substrate (111). In some embodiments, the third radiofrequency signal has a frequency of about 13.56 megaHertz, and the fourth radiofrequency signal has a frequency of about 1 megaHertz.

It should be understood that an inductively coupled plasma processing system is disclosed herein. The system includes the plasma processing chamber 100 enclosing the plasma processing volume 101. The chamber 100 has the upper window structure 105. The coil 121 is disposed outside the chamber 100 at location to allow for transmission of radiofrequency signals from the coil 121 through the upper window structure 105 into the plasma processing volume 101. The substrate support structure 107 is disposed within the chamber 100. The substrate support structure 107 is configured to hold the substrate 111 in exposure to the plasma processing volume 101. The electrode 113 is disposed within the substrate support structure 107.

A first radiofrequency signal generator 123 is connected to supply a first radiofrequency signal to the coil 121. A second radiofrequency signal generator 401 is connected to supply a second radiofrequency signal to the electrode 113 within the substrate support structure 107. The second radiofrequency signal generator 401 is independently controllable relative to the first radiofrequency signal generator 123. The second radiofrequency signal has a frequency greater than or equal to about 27 megaHertz. The second radiofrequency signal is defined to generate supplemental plasma density at a level of the substrate 111 when present upon the substrate support structure 107. The second radiofrequency signal generates a bias voltage ($V_b$) of less than about 200 volts at the level of the substrate 111 when present upon the substrate support structure 107.

In some embodiments, the first radiofrequency signal generator 123 is configured to generate the first radiofrequency signal at a frequency within a range extending from about 10 megaHertz to about 15 megaHertz, and at a power within a range extending from about 1 kiloWatt to about 4 kiloWatts. Also, in some embodiments, the second radiofrequency signal generator 401 is configured to generate the second radiofrequency signal at a frequency within a range extending from about 27 megaHertz to about 140 megaHertz, and at a power within a range extending from about 5 Watts to about 1 kiloWatt.

In some embodiments, the inductively coupled plasma processing system includes a third radiofrequency signal generator 405 connected to supply a third radiofrequency signal to the electrode 113 within the substrate support structure 107. The third radiofrequency signal generator 405 is independently controllable relative to the first and second radiofrequency signal generators (123 and 401). In some embodiments, the third radiofrequency signal has a frequency within a range extending from about 100 kiloHertz to about 15 megaHertz, and the third radiofrequency signal is supplied at a power within a range extending from about 5 Watts to about 6 kiloWatts. The third radiofrequency signal generates a bias voltage greater than about 200 volts at the level of the substrate 111 when present upon the substrate support structure 107.

In some embodiments, the inductively coupled plasma processing system includes a fourth radiofrequency signal generator 501 connected to supply a fourth radiofrequency signal to the electrode 113 within the substrate support structure 107. The fourth radiofrequency signal generator 501 is independently controllable relative to the first and second and third radiofrequency signal generators (123, 401, 405, and 501). In some embodiments, the fourth radiofrequency signal has a frequency within a range extending from about 100 kiloHertz to about 1 megaHertz, and the fourth radiofrequency signal is supplied at a power within a range extending from about 5 Watts to about 6 kiloWatts. In some embodiments, the fourth radiofrequency signal controls a directionality of ions at the level of the substrate 111 when present upon the substrate support structure 107.

Also, in some embodiments of the inductively coupled plasma processing system, the coil 121A includes multiple independently controllable radial zones (301, 303, etc.). The inductively coupled plasma processing system can include the control system 409 configured to control radiofrequency signals supplied to the multiple independently controllable radial zones (301, 303, etc.) of the coil 121A to compensate for a perturbation in plasma density profile across the substrate 111 caused by the supplemental plasma density generated at the level of the substrate 111 by the second radiofrequency signal, when the substrate 111 is present upon the substrate support structure 107.

The substrate-level supplemental plasma density generation methods and systems disclosed herein provide many benefits, including improvements in ion-assisted deposition resulting from higher deposition rates, better deposition quality in the ICP processing chamber, and better passivation/deposition for profile control in many applications, including high aspect ratio applications. Also, the substrate-level supplemental plasma density generation methods and systems disclosed herein can be incorporated into existing plasma-based fabrication applications that utilize and/or require low bias voltage ($V_b$) (low ion energy), especially where challenges exist with regard to throughput, and/or selectivity, and/or profile control, and/or line roughness, among others.

Also, by using high frequency radiofrequency signals (greater than or equal to about 27 MHz) to generate the supplemental plasma density at the substrate level, the radical and ion species within the plasma near the substrate can be different, which provides an opportunity for improvement with regard to selectivity control, and/or profile control, and/or line roughness control, among other process parameters and/or results, as well as the benefit of higher throughput due to increase reaction rate at the substrate surface. Additionally, it is more energy efficient to use high frequency radiofrequency signals (greater than or equal to about 27 MHz) a lower radiofrequency power to generate the supplemental plasma density at the substrate level, as compared to increasing the primary radiofrequency power applied to the coil 121 at a significant distance from the substrate in order to obtain the same increase in plasma density at the substrate level. For example, in a given target application, a supply of 3 kW to the coil 121 may be needed to achieve the same increase in plasma density at the substrate level that can be obtained by supplying 500 W of substrate-level supplemental plasma radiofrequency power at 60 MHz to the bias electrode 113 in the substrate support structure 107.

The substrate-level supplemental plasma density generation methods and systems disclosed herein can be used in essentially any application in which increased plasma density is needed near the substrate surface. And, because the high frequency radiofrequency signals (greater than or equal to about 27 MHz) used to generate the supplemental plasma density at the substrate level do not generate much bias voltage ($V_b$) at the substrate level, the substrate-level supplemental plasma density generation methods and systems disclosed herein can also be used in applications where increased isotropic removal of a material from the substrate is desired, such as in photoresist trim operations, by way of example. Moreover, it should be appreciated that the substrate-level supplemental plasma density generation methods and systems disclosed herein provide for separate control of the directionality of the ions and correspondingly of the etch (in the direction toward the substrate) using the bias radiofrequency signal generator(s) 405/501 operating to provide lower frequency radiofrequency signals (e.g., of 13.56 MHz, or 1 MHz, or other low frequency). And, this separate control of the directionality of the ions can be performed simultaneously with or temporally separate from operation of the substrate-level supplemental plasma density radiofrequency signal generator to provide high frequency radiofrequency signals to the bias electrode 113 to generate supplemental plasma density near the substrate surface.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for operating an inductively coupled plasma processing chamber, comprising:
   having a substrate on a substrate support structure within a plasma processing volume of the inductively coupled plasma processing chamber;
   supplying a first radiofrequency signal from a first radiofrequency signal generator to a coil disposed outside of the plasma processing volume of the inductively coupled plasma processing chamber, the first radiofrequency signal generating a plasma in exposure to the substrate; and
   supplying a second radiofrequency signal from a second radiofrequency signal generator to an electrode within the substrate support structure simultaneously with supplying of the first radiofrequency signal from the first radiofrequency signal generator to the coil, the first and second radiofrequency signal generators controlled independent of each other, the second radiofrequency signal having a frequency greater than or equal to about 27 megaHertz, the second radiofrequency signal generating supplemental plasma density at a level of the substrate within the plasma processing volume without substantially changing a bias voltage at the level of the substrate.

2. The method as recited in claim 1, wherein the first radiofrequency signal is supplied at a frequency within a range extending from about 10 megaHertz to about 15 megaHertz, and wherein the first radiofrequency signal is supplied at a power within a range extending from about 1 kiloWatt to about 4 kiloWatts.

3. The method as recited in claim 1, wherein the second radiofrequency signal is supplied at a frequency within a range extending from about 27 megaHertz to about 140 megaHertz, and wherein the second radiofrequency signal is supplied at a power within a range extending from about 5 Watts to about 1 kiloWatt.

4. The method as recited in claim 1, wherein the second radiofrequency signal is supplied at a frequency of about 27 megaHertz, and wherein the second radiofrequency signal is supplied at a power within a range extending from about 5 Watts to about 1 kiloWatt.

5. The method as recited in claim 1, wherein the second radiofrequency signal is supplied at a frequency of about 60 megaHertz, and wherein the second radiofrequency signal is supplied at a power within a range extending from about 5 Watts to about 1 kiloWatt.

6. The method as recited in claim 1, wherein the coil includes multiple independently controllable radial zones, the method further comprising controlling radiofrequency signals supplied to the multiple independently controllable radial zones of the coil to compensate for a perturbation in plasma density profile across the substrate caused by the supplemental plasma density generated at the level of the substrate by the second radiofrequency signal.

7. The method as recited in claim 1, further comprising:
   supplying a third radiofrequency signal from a third radiofrequency signal generator to the electrode within the substrate support structure in accordance with a process recipe performed on the substrate, the first and second and third radiofrequency signal generators controlled independent of each other, the third radiofrequency signal having a frequency within a range extending from about 100 kiloHertz to about 15 megaHertz, the third radiofrequency signal supplied at a power within a range extending from about 5 Watts to about 6 kiloWatts, the third radiofrequency signal generating a bias voltage greater than about 200 volts at the level of the substrate.

8. The method as recited in claim 7, wherein the first radiofrequency signal is supplied at a frequency within a range extending from about 10 megaHertz to about 15 megaHertz, and wherein the first radiofrequency signal is supplied at a power within a range extending from about 1 kiloWatt to about 4 kiloWatts, and
   wherein the second radiofrequency signal is supplied at a frequency within a range extending from about 27 megaHertz to about 140 megaHertz, and wherein the second radiofrequency signal is supplied at a power within a range extending from about 5 Watts to about 1 kiloWatt.

9. The method as recited in claim 8, wherein the third radiofrequency signal has a frequency of about 13.56 megaHertz.

10. The method as recited in claim 7, wherein the third radiofrequency signal is supplied from the third radiofrequency signal generator to the electrode within the substrate support structure during directional ion-based processing of the substrate, and wherein the third radiofrequency signal is not supplied from the third radiofrequency signal generator to the electrode within the substrate support structure during isotropic processing of the substrate.

11. The method as recited in claim 7, further comprising: supplying a fourth radiofrequency signal from a fourth radiofrequency signal generator to the electrode within the substrate support structure in accordance with the process recipe performed on the substrate, the first and second and third and fourth radiofrequency signal generators controlled independent of each other, the fourth radiofrequency signal having a frequency within a range extending from about 100 kiloHertz to about 1 megaHertz, the fourth radiofrequency signal supplied at a power within a range extending from about 5 Watts to about 6 kiloWatts, the fourth radiofrequency signal controlling a directionality of ions at the level of the substrate.

12. The method as recited in claim 11, wherein the first radiofrequency signal is supplied at a frequency within a range extending from about 10 megaHertz to about 15 megaHertz, and wherein the first radiofrequency signal is supplied at a power within a range extending from about 1 kiloWatt to about 4 kiloWatts, and wherein the second radiofrequency signal is supplied at a frequency within a range extending from about 27 megaHertz to about 140 megaHertz, and wherein the second radiofrequency signal is supplied at a power within a range extending from about 5 Watts to about 1 kiloWatt.

13. The method as recited in claim 12, wherein the third radiofrequency signal has a frequency of about 13.56 megaHertz, and wherein the fourth radiofrequency signal has a frequency of about 1 megaHertz.

14. The method as recited in claim 13, wherein the second radiofrequency signal has a frequency of about 60 megaHertz.

15. The method as recited in claim 13, wherein the second radiofrequency signal has a frequency of about 27 megaHertz.

* * * * *